United States Patent
Debelius et al.

(10) Patent No.: US 7,325,716 B2
(45) Date of Patent: Feb. 5, 2008

(54) DENSE INTERMETALLIC COMPOUND LAYER

(75) Inventors: Christopher August Debelius, Rio Rancho, NM (US); Jianxing Li, Albuquerque, NM (US)

(73) Assignee: Intel Corporation, Santa Clara, CA (US)

( * ) Notice: Subject to any disclaimer, the term of this patent is extended or adjusted under 35 U.S.C. 154(b) by 151 days.

(21) Appl. No.: 10/926,115

(22) Filed: Aug. 24, 2004

(65) Prior Publication Data

US 2006/0043156 A1 Mar. 2, 2006

(51) Int. Cl.
 *B23K 31/02* (2006.01)
 *H01L 23/48* (2006.01)
 *H01L 21/44* (2006.01)

(52) U.S. Cl. .......... 228/180.22; 228/227; 257/737; 438/613

(58) Field of Classification Search ............ None
 See application file for complete search history.

(56) References Cited

U.S. PATENT DOCUMENTS

| | | | |
|---|---|---|---|
| 5,849,631 A * | 12/1998 | Ishikawa et al. ............ 438/615 |
| 6,610,595 B2 | 8/2003 | Seshan | |
| 6,669,077 B1 * | 12/2003 | Kawashima et al. ... 228/180.21 |
| 6,734,568 B2 * | 5/2004 | Matsuo et al. .............. 257/781 |
| 6,805,974 B2 * | 10/2004 | Choi et al. ................... 428/646 |
| 7,064,446 B2 * | 6/2006 | Barnak et al. .............. 257/779 |
| 2003/0155408 A1 * | 8/2003 | Fanti et al. ................. 228/215 |
| 2003/0193094 A1 * | 10/2003 | Takahashi et al. ......... 257/780 |
| 2005/0072834 A1 * | 4/2005 | Zeng ..................... 228/180.22 |
| 2005/0212133 A1 * | 9/2005 | Barnak et al. .............. 257/738 |
| 2005/0279812 A1 * | 12/2005 | Tago et al. .............. 228/180.5 |

* cited by examiner

*Primary Examiner*—Kiley Stoner

(57) ABSTRACT

Apparatus and methods of fabricating a bump limiting metallization structure including a two-step bump reflow process that reduces intermetallic compound porosity, increases bump strength, improve die yield, and device reliability. The first step comprises annealing a bump limiting metallurgy and a solder plug at a temperature below the liquidus temperature of the solder plug to form a dense intermetallic compound layer between the solder plug and the bump limiting metallurgy. The second step comprises heating the bump limiting metallurgy and the solder plug at a temperature above the liquidus temperature of the solder plug to form a solder bump.

6 Claims, 6 Drawing Sheets

DENSE INTERMETALLIC COMPOUND LAYER

BACKGROUND OF THE INVENTION

1. Field of the Invention

Embodiments of the present invention relate to microelectronic device fabrication. In particular, an embodiment of the present invention relates to methods of fabricating bump limiting metallurgy (BLM) structure, which results in a dense intermetallic compound layer for increased bump strength and adhesion to metal pad and passivation layer.

2. State of the Art

The microelectronic device industry continues to see tremendous advances in technologies that permit increased circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second), to be packaged in relatively small, air-cooled microelectronic device packages. A result of such high density and high functionality in microelectronic devices has been the demand for increased numbers of external electrical connections to be present on the exterior of the microelectronic die in order to connect the microelectronic die to other components, such as an interposer.

The connection mechanism for such high density connection is generally wafer level bumping through a C4 (controlled collapse chip connection) process, because the size of the balls or bumps of the array can be made smaller to provide a higher density thereof, and thereby creating a greater number of connections from microelectronic die. A C4 is formed by placing an amount of solder on a microelectronic die pad and heating the solder above its melting point. The surface tension associated with the liquid solder causes the solder to form a solder ball. The solder ball retains its shape as it cools to form a solid solder ball or bump. While the description here is for wafer level bumping, the principle could be applied to ball grid array packaging.

As shown in FIG. 10, an exemplary microelectronic package 400 includes a microelectronic die 402 that is mounted on a substrate 404, such as an interposer, a motherboard, and the like, which functionally connects the microelectronic die 402 through a hierarchy of electrically conductive paths (not shown) to the other electronic components (not shown). The illustrated method for electronically mounting the microelectronic die 402 to the substrate 404 is called flip chip bonding. In this mounting method, electrically conductive Ball Limiting Metallurgy (BLM) 406 abutting a bond pad 424 on an active surface 410 of the microelectronic die 402 is attached directly to corresponding lands 412 on a surface 414 of the substrate 404 using solder bumps or balls 416, which are reflowed to from the attachment therebetween.

As shown in FIG. 11, the BLM 406 is connected through a passivation layer 422 to the bond pad 424. The passivation layer 422 comprises one or more layer of electrically insulative material, including, but not limited to, silicon dioxide, silicon nitride, and polyimide. The bond pad 424 is connected to a metal line 426 by way of a via 428. The via 428 and metal line 426 are disposed in at least one interlayer dielectric (illustrated as multiple layers 432a, 432b, and 432c).

The BLM 406 provides a reliable electrical and mechanical interface between the bond pad 424 and the solder bump 416. A typical BLM includes at least one conductive layer which will act to adhere to the solder ball 416 and bond pad 424 and to prevent contamination between the solder bump 416 and the microelectronic die 402. Of course, multiple layers may be used to form the BLM 406. For example, the BLM 406 may consist of an adhesion layer 442 for attachment to the bond pad 424, a barrier layer 444 over the adhesion layer 442 to prevent contamination between the solder bump 416 and microelectronic die (not shown), and a wetting layer 446 between the barrier layer 444 and the solder bump 416 to "wet" or adhere to the solder bump 416 material.

A nickel-vanadium-nitrogen alloy may be used as at least one layer in the BLM 406, particularly as an wetting layer 446. The solder bump 416 generally contains tin, such as lead/tin alloys or lead free solders, such as substantially pure tin or high tin content alloys (90% or more tin), such as tin/bismuth, eutectic tin/silver, ternary tin/silver/copper, eutectic tin/copper, and the like. However, solder bump 416 reflow attachment discussed above generally comprises a one-step reflow process. This one-step reflow process generates voids 138, shown in FIG. 4, in the wetting layer 446, specifically the nickel-vanadium-nitrogen alloy layer, due to high thermal budget of the reflow process. These voids 138 are formed during the formation of an intermetallic compound layer 440, which is the reaction product between the tin in the solder bump 416 and the nickel in the wetting layer 446. Intermetallic compounds form when two unlike metals diffuse into one another creating species materials which are combinations of the two materials. Intermetallic growth is the result of the diffusion of one material (i.e., the nickel of the nickel-vanadium-nitrogen alloy layer) into another (i.e., the solder bump 416) through crystal vacancies made available by defects, contamination, impurities, grain boundaries, and mechanical stress. If one material overwhelms the other in volume, as is the situation with the solder ball and the BLM, and diffusion occurs rapidly enough, crystal vacancies form. These vacancies attract each other which results in the creation of voids. These voids are called Kirkendall voids. Excessive Kirkendall voiding in the BLM lowers its adhesion and lowers device reliability. Furthermore, the one-step reflow process may also generate a solder bump 416 with low strength, which is primarily responsible for bump crack after reliability and chip attach yield loss due to non-optimized bump surface profile.

Therefore, it would be advantageous to develop apparatus and techniques to form an intermellatic compound layer which would have improved adhesion and device reliability.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings to which:

DETAILED DESCRIPTION OF THE ILLUSTRATED EMBODIMENT

Figure 1:
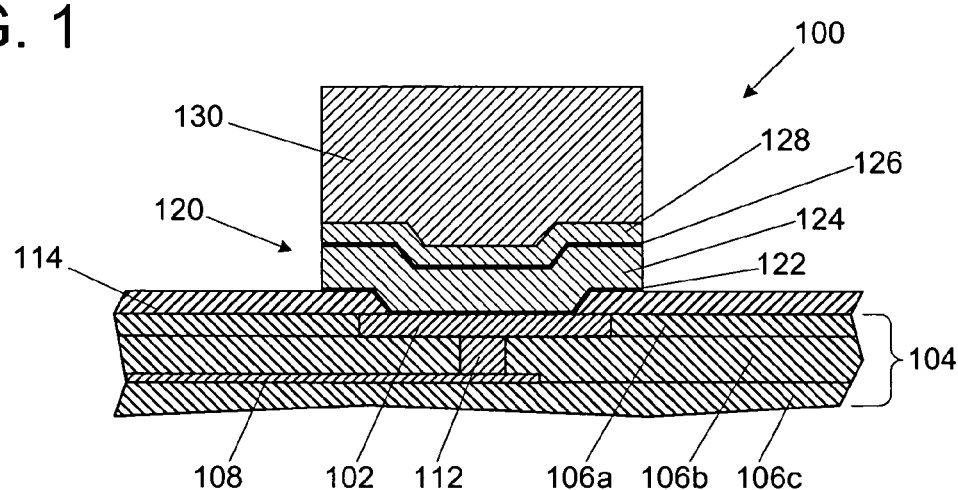
FIG. 1 is a side cross-sectional view of a bump limiting metallization structure and solder plug before bump reflow, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

An embodiment of the present invention comprises a two-step bump reflow process that reduces intermetallic compound porosity, increases bump strength, improve die yield, and device reliability.

FIG. 1 illustrates a flip-chip assembly 100 including a bump limiting metallization ("BLM") structure 120 formed on a conductive pad 102. The conductive pad 102 is fabricated in or on an interconnect structure 104. The conductive pad 102 can be made of any appropriate conductive material including, but not limited to, copper, aluminum, and alloys thereof. The interconnect structure 104 may be a plurality of interlayer dielectric layers, illustrated as elements 106a, 106b, and 106c, fabricated on a microelectronic die (not shown). The interlayer dielectric layers 106a, 106b, and 106c may be fabricated from any appropriate dielectric material including, but not limited to silicon oxide, silicon nitride, and the like, as well as low-k dielectrics, such as carbon doped oxides.

The conductive pad 102 is connected to a conductive trace 108 through a conductive via 112. The conductive trace 108 is routed to the microelectronic die (not shown), as will be understood by those skilled in the art. A passivation layer 114, such as polyimide, may be deposited on the interconnect structure 104 and patterned to expose at least a portion of the conductive pad 102.

The BLM structure 120 is fabricated to contact the conductive pad 102 and may be formed with a first adhesion layer 122, a barrier layer 124, a second adhesion layer 126, and a wetting layer 128. The first adhesion layer 122 may be formed on a portion of the passivation layer 114 and the conductive pad 102. The first adhesion layer 122 is selected to adhere well to the conductive pad 102 and the passivation layer 114, and may include, but is not limited to, titanium and alloys thereof. The barrier layer 124 is formed on the first adhesion layer 122 to limit the diffusion of material(s) within a solder bump to be formed on the BLM structure 120 to the adhesion layer 122, conductive pad 102, and interconnect structure 104 and may include, but is not limited to, comprises aluminum, aluminum alloys, molybdenum, molybdenum alloys, and the like. The second adhesion layer 126 is formed on the barrier layer 124 and selected provide adhesion between the barrier layer 124 and the wetting layer 128. The second adhesion layer 126 may include, but is not limited to, titanium and alloys thereof. The wetting layer 128 is formed on the second adhesion layer 126 to provide an easily wettable surface for the molten solder bump during assembly for good bonding of the solder to the barrier layer 124 and may include, but is not limited to, nickel-containing alloys, such nickel-vanadium-nitrogen alloy. The first adhesion layer 122, the barrier layer 124, the second adhesion layer 126, and the wetting layer 128 may be formed by any method known in the art, including but not limited to, deposition by physical vapor deposition (sputtering), chemical vapor deposition, evaporation, electroplating, electroless plating, and ion beam deposition.

A solder plug 130 is formed on the wetting layer 128 and may comprise a tin-containing material, including but not limited to, lead/tin alloy, and substantially pure tin or high tin content alloys, such as such as tin/bismuth, tin/silver, ternary tin/silver/copper, tin/copper, and the like. The solder plug 130 may be fabricated by any known method in the art including, but not limited to, electroplating, jet plating, and screen printing of a solder paste.

It is, of course, understood that any number of layers may comprise the BLM structure 120. For example, if a selected material can act as a barrier layer and a wetting layer, and is sufficiently adhesive to the solder plug 130 and the conductive pad 102, then only one material layer would be required to form the BLM structure 120.

The solder plug 130 is subsequently reflowed with a two-stage process. A first stage comprises a solid state diffusion by annealing the solder plug 130 and the BLM structure 120 at a temperature lower than the melting temperature of the solder plug 130. The annealing stage results in the formation of a dense intermetallic compound layer 132 from the diffusion of at least one metal of the wetting layer 128 into the solder plug 130. The annealing stage can be conducted at a temperature within about 20 percent of the liquidus temperature of the solder plug 130. The temperature for the solid state diffusion needs to be chosen to effectively diffuse at least one component in the wetting layer 128 and form the intermetallic compound, but excessive heat in this stage will adversely promote voids in the BLM structure.

Figure 2:
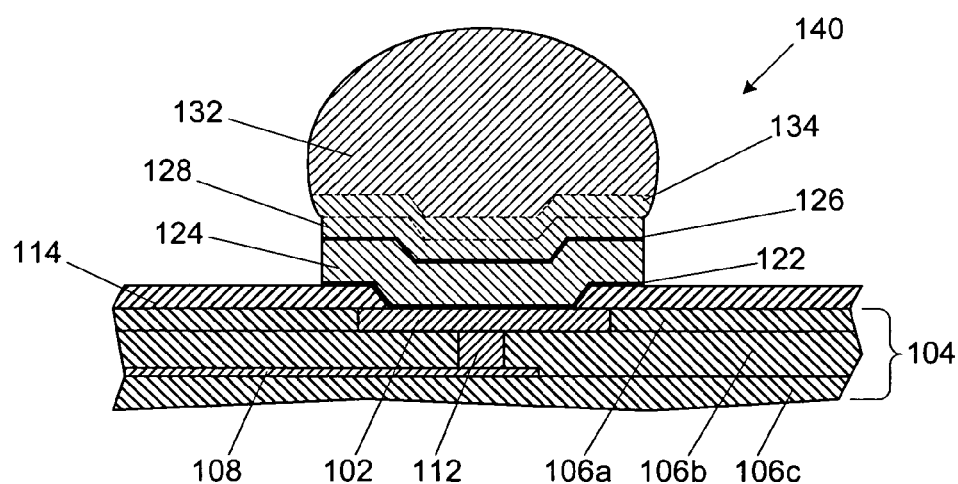
FIG. 2 is a side cross-sectional view of a bump limiting metallization structure and solder bump formed by a two-step process, according to the present invention.

The second stage is a reflow stage, preferably a low thermal budget bump reflow, in which the solder plug 130 is reflowed to form a sphere or solder bump 134 without excessive intermetallic growth due to the dense intermetallic compound layer 132 formed in the annealing stage, as shown in FIG. 2. The reflow stage can be conducted at a temperature between the liquidus temperature of the solder plug and about 10 percentage thereabove. The temperature must be high enough to reflow the solder plug 130, yet not cause the excessive intermetallic compound layer growth and BLM voids.

In one embodiment of the present invention, the BLM structure 120 is fabricated with a first adhesion layer 122 comprising a titanium layer about 1000 angstroms thick contacting the conductive pad 102, a barrier layer 124 comprising aluminum layer about 10,000 angstroms thick abutting the first adhesion layer 122, a second adhesion layer 126 comprising a titanium layer about 1000 angstroms thick abutting the barrier layer 124, and a wetting layer 128 comprising a nickel-vanadium-nitrogen alloy layer about 4000 angstrom thick abutting the second adhesion layer. In this embodiment, the nickel-vanadium-nitrogen alloy layer comprises about 89% nickel, about 7% vanadium, and about 4% nitrogen by weight.

Figure 3:
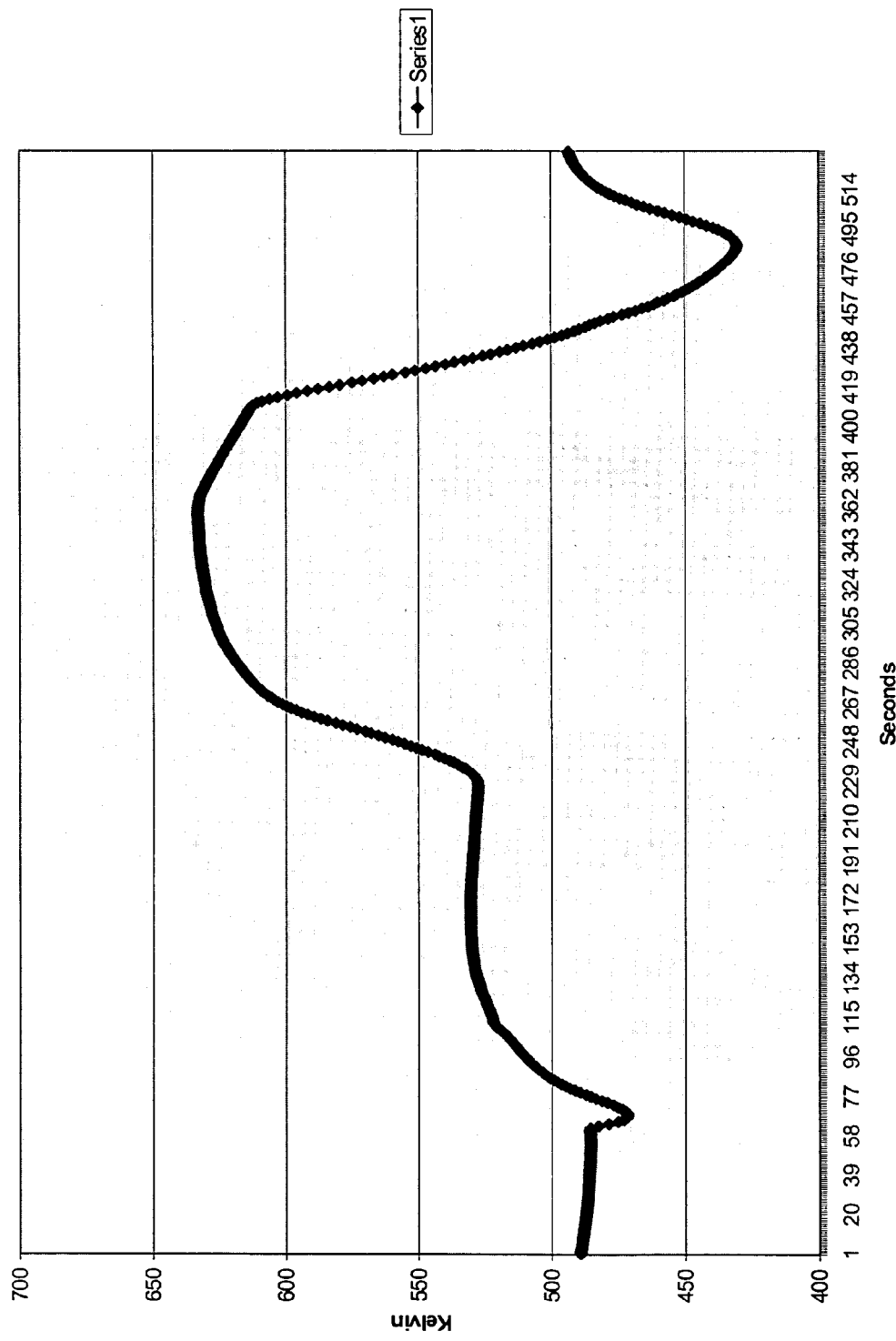
FIG. 3 is a graph of the two-step process as a function of temperature versus time, according to the present invention.

A solder plug 130 comprising a lead/tin alloy (97% lead/3% tin in this embodiment) is formed on the wetting layer 128. As illustrated in the graph in FIG. 3, the solder plug 130 is reflowed with the two-stage process. The annealing stage comprises heating the solder plug 130 and the BLM structure 120 in a reducing hydrogen atmosphere to a temperature of about 530 degrees Kelvin for approximately 150 minutes resulting in the formation of a dense intermetallic compound layer 132 primarily of nickel from the wetting layer 128 and tin from the solder plug 130. The reducing hydrogen atmosphere reduces bump surface oxide formation during BLM etch operation, thereby ensuring that the solder plug 130 are properly wet and solid electrical and mechanical joins during subsequent chip assembly operations. The anneal stage is followed by the reflow stage that comprises heating the solder plug 130 and the BLM structure 120 to a temperature of about 635 degrees Kelvin (wherein the liquidus temperature of the solder plug 130 is about 600 degrees Kelvin) to form a solder bump 134.

Figure 4:
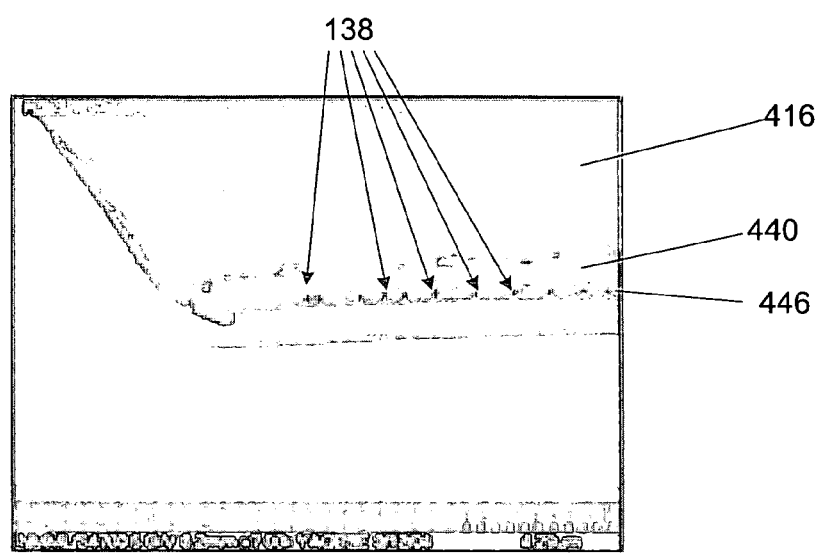
FIG. 4 is a cross-section scanning electronic micrograph of a bump limiting metallization structure and solder bump formed by a single step reflow process, as known in the art.
Figure 5:
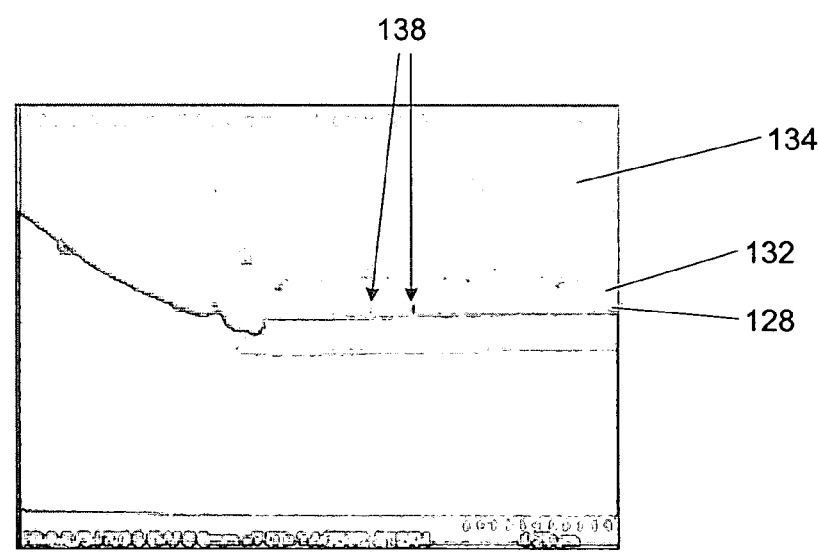
FIG. 5 is a cross-section scanning electronic micrograph of a bump limiting metallization structure and solder bump formed by a two-step process, according to the present invention.

This process results in solder bump(s) without excessive intermetallic growth and without void in BLM structure 120 due to the dense intermetallic compound layer 132 formed in the annealing stage. The difference between a single stage reflow process and the two-stage process of the present invention is illustrated in FIGS. 4 and 5, respectively. FIG. 4 shows a portion of a solder bump 416 fabricated with the materials discussed with regard to FIG. 3, but processed according to a single stage reflow process known prior art, wherein the solder plug and the BLM structure was simply heated to a temperature of about 675 degrees Kelvin. As will be noted, numerous voids 138 have formed in the wetting layer 446, as a "non-dense" intermetallic compound layer 440 by the prior art technique. FIG. 5 shows a portion of a solder bump 134 fabricated in the manner discussed with regard to FIG. 3. As will be noted, few voids 138 are formed in the wetting layer 128. The reduction in voids 138 increases the overall strength, optimizes bump morphology, and improves overall BLM reliability and die yield, as will be understood to those skilled in the art.

In one embodiment of the present invention, a density of the intermetallic compound layer is estimated or calculated from the wetting layer 128 reflow by the following equation:

$$\text{Intermetallic Compound Layer Density} = 1 - (nA/HL)$$

wherein:
n=number of voids 138 in the wetting layer 128
A=the average surface area of the voids 138
H=height or thickness of the wetting layer 128
L=length or diameter of the wetting layer 128

The intermetallic compound layer density of the prior art process, shown in FIG. 4, is about 0.80. The intermetallic compound layer density of the process according to the present invention, shown in FIG. 5, is about 0.95.

Figure 6:
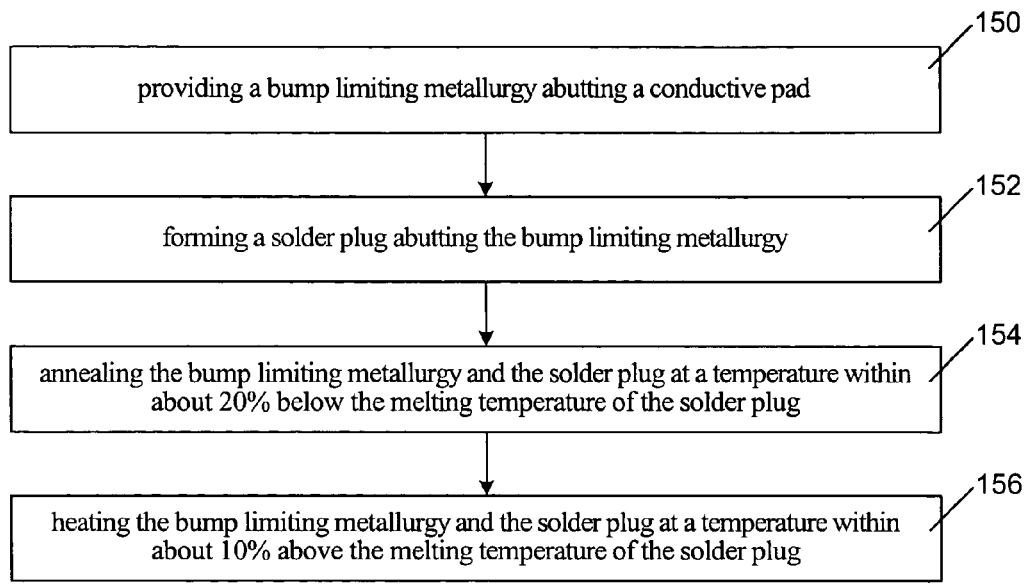
FIG. 6 is a flow diagram of a process for fabricating the bump limiting metallization structure and a solder bump in a two-step process, according to the present invention.

FIG. 6 illustrates a schematic of a method of forming a dense intermetallic compound layer and a solder bump. Step 150 comprises providing a bump limiting metallurgy abutting conductive pad. Step 152 comprises forming a solder plug abutting said bump limiting metallurgy. Step 154 comprises annealing the bump limiting metallurgy and the solder plug at a temperature within about 20% below the liquidus temperature of the solder plug to form a dense intermetallic compound layer between the solder plug and the bump limiting metallurgy. Step 156 comprises heating the bump limiting metallurgy and the solder plug at a temperature within about 10% above the liquidus temperature of the solder plug to form a solder bump.

Although the present invention is described in terms of applying to a microelectronic die, the present invention can apply to any bump limiting metallurgy including, but not limited to, those fabricated on an interposer, as will be understood by those skilled in the art.

Figure 7:
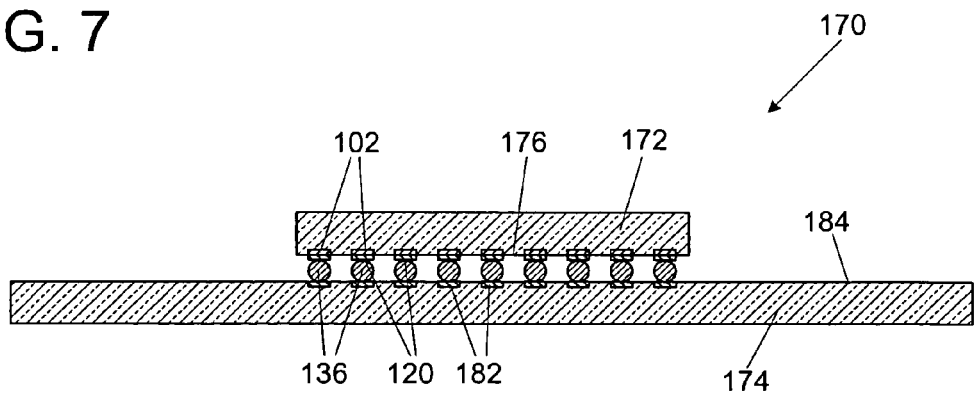
FIG. 7 is a side view of a microelectronic die attached to a substrate, according to the present invention.

FIG. 7 illustrates an exemplary microelectronic package 170 according to the present invention, which includes a microelectronic die 172 that is mounted on a substrate 174, such as an interposer, a motherboard, and the like, which functionally connects the microelectronic die 172 through a hierarchy of electrically conductive paths (not shown) to the other electronic components (not shown). The conductive pads 102 on an active surface 176 of the microelectronic die 172 has the BLM structure 120 disposed thereon, as previously discussed. The BLM structure 120 is attached directly to corresponding lands 182 on a surface 184 of the substrate 174 using solder bumps 136, which are reflowed to form the attachment therebetween.

Figure 8:
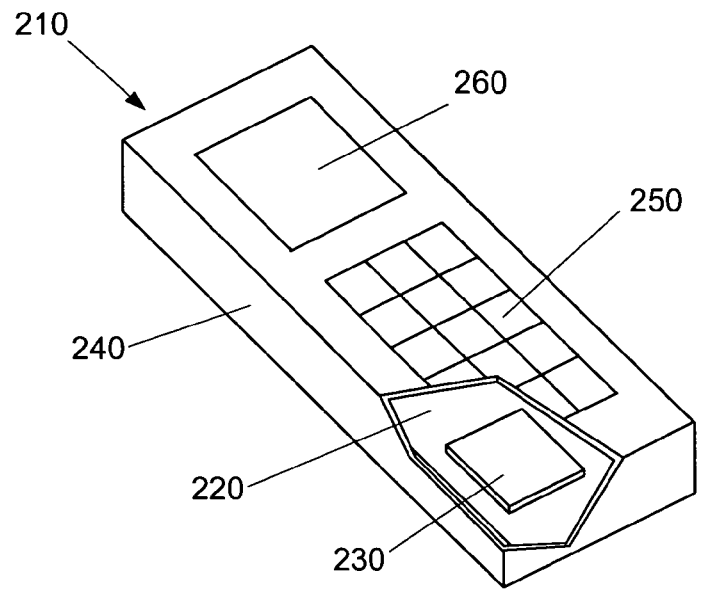
FIG. 8 is an oblique view of a hand-held device having a microelectronic assembly of the present integrated therein, according to the present invention.

The packages formed by the present invention may be used in a hand-held device 210, such as a cell phone or a personal data assistant (PDA), as shown in FIG. 8. The hand-held device 210 may comprise an external substrate 220 with at least one microelectronic device assembly 230, including but not limited to, a central processing units (CPUs), chipsets, memory devices, ASICs, and the like, having at least one BLM structure 120 as described above, within a housing 240. The external substrate 220 may be attached to various peripheral devices including an input device, such as keypad 250, and a display device, such an LCD display 260.

Figure 9:
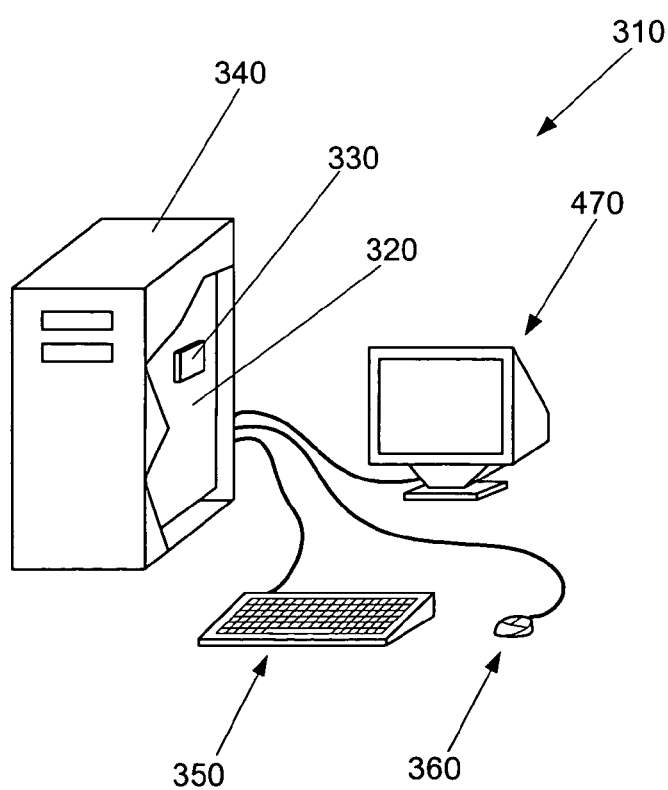
FIG. 9 is an oblique view of a computer system having a microelectronic assembly of the present integrated therein, according to the present invention.
Figure 10:
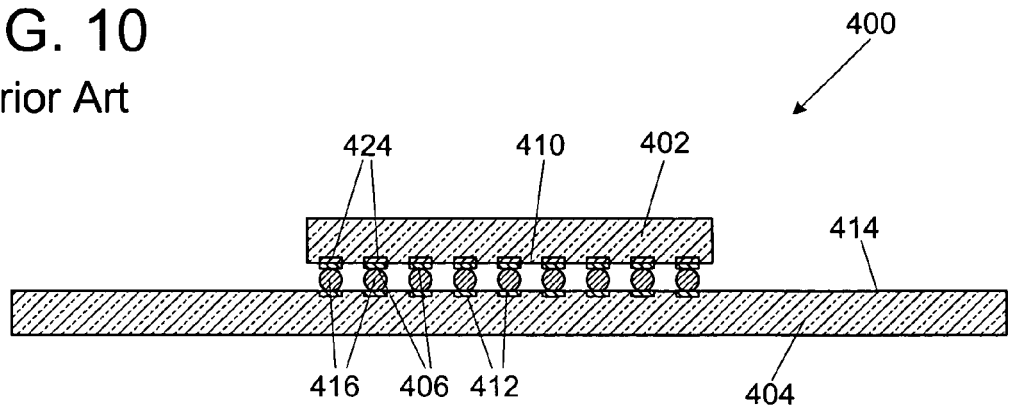
FIG. 10 is a side view of a microelectronic die attached to a substrate, as known in the art.
Figure 11:
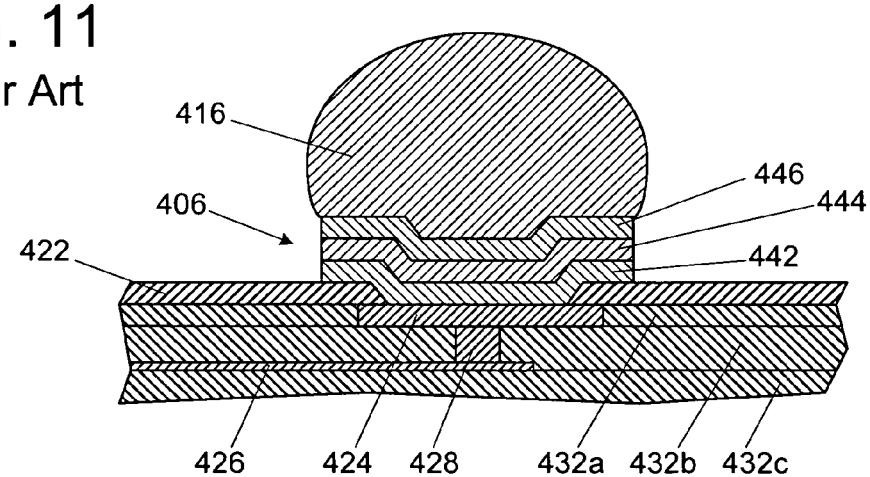
FIG. 11 is a side cross-sectional view of a bump limiting metallization structure and solder bump formed by a one step process, as known in the art.

The microelectronic device assemblies formed by the present invention may also be used in a computer system 310, as shown in FIG. 9. The computer system 310 may comprise an external substrate or motherboard 320 with at least one microelectronic device assembly 330, including but not limited to, a central processing units (CPUs), chipsets, memory devices, ASICs, and the like, having at least one BLM structure 120 as described above, within a housing or chassis 340. The external substrate or motherboard 320 may be attached to various peripheral devices including inputs devices, such as a keyboard 350 and/or a mouse 360, and a display device, such as a CRT monitor 370.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An apparatus, comprising:
   a solder bump;
   a wetting layer; and
   a dense intermetallic compound, having a density of greater than about 0.95, formed between said solder bump and said wetting layer.

2. The apparatus of claim 1, wherein said solder bump comprises a lead/tin alloy.

3. The apparatus of claim 1, wherein said lead/tin alloy solder bump comprises about 97% lead and about 3% tin.

4. The apparatus of claim 3, wherein said wetting layer comprises nickel-containing alloy.

5. The apparatus of claim 4, wherein said nickel-vanadium-nitrogen alloy comprises about 89% nickel, about 7% vanadium, and about 4% nitrogen by weight.

6. The apparatus of claim 1, wherein the dense intermetallic compound is formed by way of a solid state diffusion by annealing the apparatus at a temperature lower Than a melting temperature of the solder bump.

* * * * *